United States Patent
Kikuchi

(10) Patent No.: US 8,178,421 B2
(45) Date of Patent: May 15, 2012

(54) METHOD OF FABRICATING SEMICONDUCTOR DEVICE

(75) Inventor: Hidekazu Kikuchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/850,833

(22) Filed: Sep. 6, 2007

(65) Prior Publication Data

US 2008/0070379 A1    Mar. 20, 2008

(30) Foreign Application Priority Data

Sep. 15, 2006  (JP) ................. 2006-251611

(51) Int. Cl.
*H01L 21/44* (2006.01)
(52) U.S. Cl. ............... 438/462; 438/460; 257/E21.002; 257/E21.597
(58) Field of Classification Search .................. 438/460, 438/462; 257/E21.002, E21.597
See application file for complete search history.

(56) References Cited

U.S. PATENT DOCUMENTS

| | | | | |
|---|---|---|---|---|
| 5,949,140 | A * | 9/1999 | Nishi et al. | 257/728 |
| 6,943,442 | B2 * | 9/2005 | Sunohara et al. | 257/700 |
| 7,022,609 | B2 | 4/2006 | Yamamoto et al. | |
| 7,339,273 | B2 * | 3/2008 | Kameyama et al. | 257/774 |
| 2002/0127839 | A1 * | 9/2002 | Umetsu et al. | 438/618 |
| 2002/0160598 | A1 * | 10/2002 | Kong | 438/613 |
| 2005/0145191 | A1 | 7/2005 | Cohen et al. | |
| 2005/0194670 | A1 | 9/2005 | Kameyama et al. | |
| 2006/0141750 | A1 * | 6/2006 | Suzuki et al. | 438/460 |
| 2006/0278974 | A1 * | 12/2006 | Hsiao et al. | 257/706 |
| 2007/0001307 | A1 * | 1/2007 | Usui et al. | 257/758 |
| 2007/0090543 | A1 * | 4/2007 | Condie et al. | 257/787 |
| 2008/0171421 | A1 * | 7/2008 | Suzuki et al. | 438/459 |

FOREIGN PATENT DOCUMENTS

| | | | |
|---|---|---|---|
| JP | 4335552 | A | 11/1992 |
| JP | 2001068618 | A | 3/2001 |
| JP | 2002305282 | A | 10/2002 |
| JP | 2004-095849 | | 3/2004 |
| JP | 2005235859 | A | 9/2005 |

* cited by examiner

*Primary Examiner* — Jarrett Stark

(74) *Attorney, Agent, or Firm* — Volentine & Whitt, PLLC

(57) ABSTRACT

A method of manufacturing a semiconductor device capable of preventing a cut portion from becoming chipped when dicing. The method of manufacturing a semiconductor device includes preparing a semiconductor wafer having an upper surface (first surface) including a plurality of device regions and partition regions for dividing the plurality of device regions, and a lower surface (second surface) opposite from the upper surface (first surface), forming upper layer wires on the device regions of the upper surface (first surface), etching the semiconductor wafer from a side of the lower surface (second surface) to form a through hole through which the upper layer wire is exposed, and to form a groove in a region of the lower surface (second surface) corresponding to the partition region of the upper surface (first surface), and dicing the semiconductor wafer to form individual device regions.

7 Claims, 8 Drawing Sheets

METHOD OF FABRICATING SEMICONDUCTOR DEVICE

CROSS-REFERENCE TO RELATED APPLICATION

This application claims priority under 35USC 119 from Japanese Patent Application No. 2006-251611, the disclosure of which is incorporated by reference herein.

BACKGROUND OF THE INVENTION

1. Field of the Invention

The present invention relates to a method of manufacturing a semiconductor device, and more particularly, to a method of manufacturing a semiconductor device having a penetrating electrode.

2. Description of Related Art

In a conventional method of manufacturing a semiconductor device, a circuit device including a semiconductor device such as a transistor is formed on a semiconductor substrate in its wafer state and then, it is diced into individual semiconductor devices using a dicing blade.

As a reference technique, Japanese Patent Application Laid-open (JP-A) No. 2004-95849 discloses a technique for forming a small hole in a semiconductor substrate using a deeply excavating technique such as Deep-RIE (reactivity ion etching).

However, in a recent semiconductor device, a relatively thin semiconductor substrate is used. Thus, when a semiconductor device is diced into individual pieces using the conventional dicing method, the cut portion becomes chipped during the dicing operation in some cases.

Hence, it is an object of the present invention to provide a method of manufacturing a semiconductor device capable of preventing the cut portion from becoming chipped during the dicing operation.

SUMMARY OF THE INVENTION

To achieve the above object, the present invention provides a method of manufacturing a semiconductor device including: preparing a semiconductor wafer having a first surface including a plurality of device regions and partition regions for dividing the plurality of device regions, and a second surface opposite from the first surface: forming wires on the device regions of the first surface; etching the semiconductor wafer from a side of the second surface to form a through hole through which the wire is exposed, and to form a groove in a region of the second surface corresponding to the partition region of the first surface; and dicing the semiconductor wafer to form individual device regions.

Further, the invention also provides a method of manufacturing a semiconductor device including: preparing a semiconductor wafer having a first surface including a plurality of device regions and partition regions for dividing the plurality of device regions, and a second surface opposite from the first surface; forming wires on the device regions of the first surface; and etching the semiconductor wafer from a side of the second surface to form a through hole through which the wire is exposed, and to form a groove in a region of the second surface corresponding to the partition region of the first surface, the groove penetrating the semiconductor wafer.

According to the invention, it is possible to provide a method of manufacturing a semiconductor device capable of preventing the cut portion from becoming chipped during the dicing operation.

BRIEF DESCRIPTION OF THE DRAWINGS

Preferred exemplary embodiments of the present invention will be described in detail based on the following figures, wherein.

DETAILED DESCRIPTION OF THE INVENTION

Figure 1A:
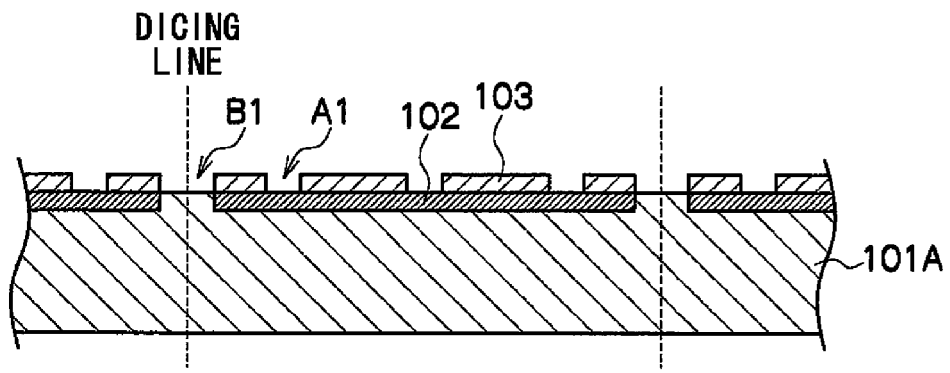
FIG. 1A is a process diagram showing a method of manufacturing a semiconductor device according to any one of first to third embodiments of the invention.
Figure 1B:
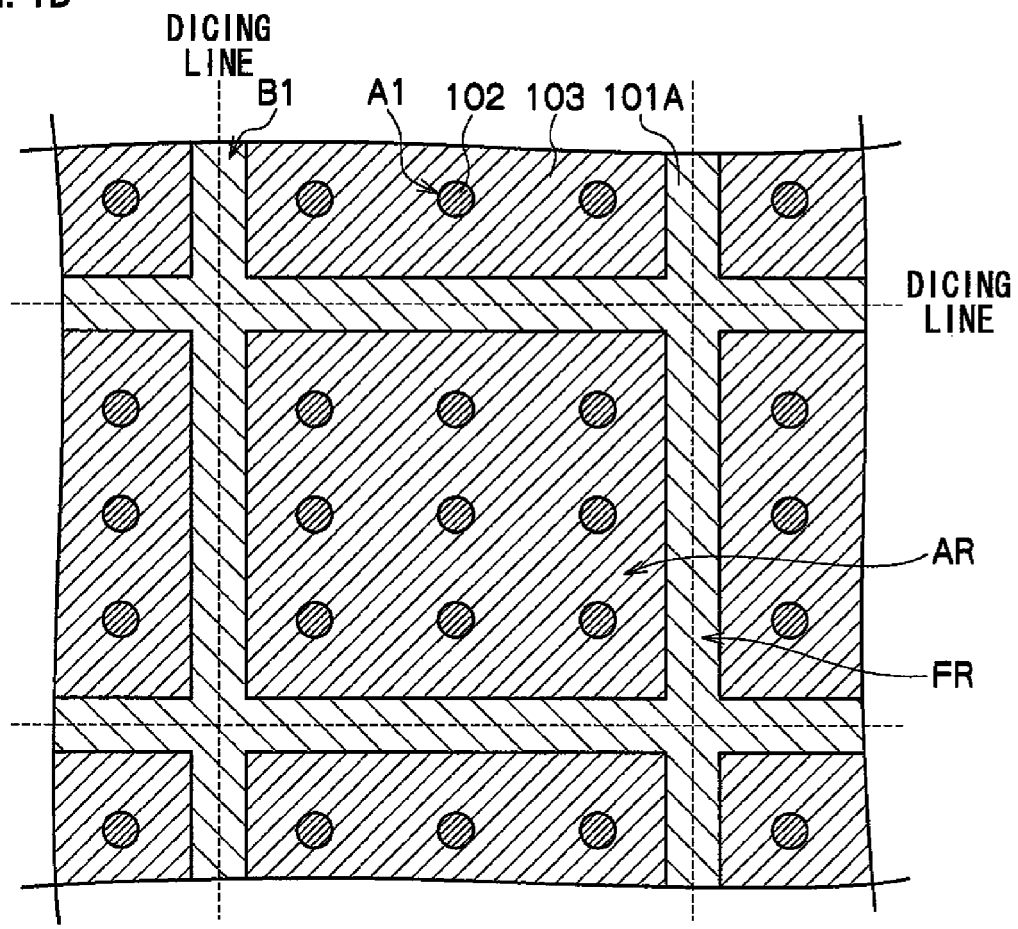
FIG. 1B is a process diagram showing the method of manufacturing a semiconductor device according to any one of the first to third embodiments of the invention.

The best mode for carrying out the invention will be explained in detail with reference to the drawings.

[First Embodiment]

First, a first embodiment of the invention will be explained in detail using the drawings. FIGS. 1A to 5B are process diagrams showing a method of manufacturing a semiconductor device of this embodiment.

In this manufacturing method, a semiconductor wafer 101A formed with devices such as transistors and upper layer wirings 102, which are electrically connected to the devices, is prepared. The diameter of the semiconductor wafer 101A is 6 or 8 inches. When a semiconductor wafer 101A whose diameter is 6 inches is used, its thickness is about 625 μm (micrometer). When a semiconductor wafer 101A whose diameter is 8 inches is used, its thickness is about 725 μm. However, the invention is not limited to this, and semiconductor wafer of various sizes can be used. The upper layer wiring 102 and other wiring are formed in a plurality of regions (device region AR in FIG. 1B) to be formed with various kinds of devices on the semiconductor wafer 101A. The device regions AR in the semiconductor wafer 101A are partitioned by partition regions FR defined along dicing lines.

Next, insulative resin such as epoxy resin and urethane resin is applied, thereby forming a protective film 103 covering the entire upper surface of the semiconductor wafer 101A. Here, the upper surface of the semiconductor wafer 101A is a surface on which devices such as transistors and the upper layer wirings 102 are formed. If the protective film 103 is formed using a photolithography technique and etching technique, openings A1 from which portions of the upper layer wirings 102 are exposed and openings B1 from which semiconductor wafers 101A are exposed along the dicing lines are formed in the protective film 103. When the protective film 103 is formed using resin having photosensitivity such as polyimide, if the protective film 103 formed on the entire upper surface of the semiconductor wafer 101A is exposed to light with a predetermined pattern, the openings A1 and B1 can be formed in the protective film 103. It is preferable that the width of the opening B1 is wider than the thickness of the dicing blade used for cutting the semiconductor wafer 101B in a subsequent step. For example, when a dicing blade having the thickness of 30 to 50 μm is used, it is preferable that the width of the opening B1 is 50 μm or more. This is because that the dicing blade comes into contact with the protective film 103 at the time of cutting operation to prevent the protective film 103 from being damaged.

Next, metal bumps 104 are formed on the upper layer wiring 102 exposed from the openings A1. Each metal bump 104 includes a diffusion-preventing film 104a, a backing metal film 104b and a metal-plated film 104c. The diffusion-preventing film 104a is for preventing atoms forming the metal-plated film 104c from being diffused. The metal-plated film 104c is a main wiring portion of the metal bump 104. The backing metal film 104b functions as a seed layer when the metal-plated film 104c is formed by the electrolytic plating method. The metal-plated film 104c is the main wiring portion.

The metal bump 104 having such a structure can be formed through the following step for example. In this step, a conductive material capable of functioning as a diffusion-preventing film by the sputtering method or the CVD (Chemical Vapor Deposition) method is deposited, thereby forming the diffusion-preventing film 104a on the entire upper surface of the semiconductor wafer 101A. Then, metal capable of functioning as a seed layer at the time of metal plating is deposited by the sputtering method or the CVD method, thereby forming the backing metal film 104b on the entire upper surface of the diffusion-preventing film 104a. Here, when the metal-plated film 104c which is the main wiring portion is a copper-plated film, the diffusion-preventing film 104a can be formed of tantalum nitride (TaN), titanium (Ti) or titanium nitride (TiN). The backing metal film 104b may be formed of copper (Cu) or the like. Then, the photolithography technique is used to form a photoresist having an opening through which the backing metal film 104b in at least in the opening A1 is exposed. Next, metal such as copper is deposited on the backing metal film 104b exposed from the photoresist by the metal plating method while using the photoresist as a mask, thereby forming the metal-plated film 104c. Then, the photoresist is removed, the metal-plated film 104c is used as a mask, the exposed backing metal film 104b and the diffusion-preventing film 104a are sequentially etched, and the metal bump 104 including the diffusion-preventing film 104a, the backing metal film 104b and the metal-plated film 104c is formed.

Figure 2A:
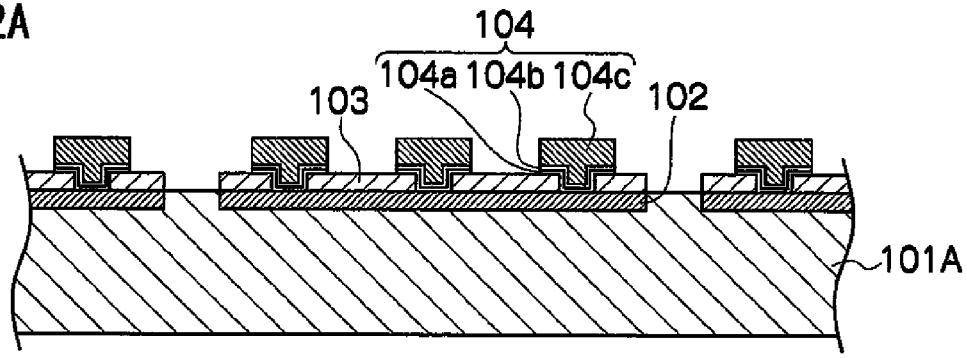
FIG. 2A is a process diagram showing the method of manufacturing a semiconductor device according to any one of the first to third embodiments of the invention.
Figure 2B:
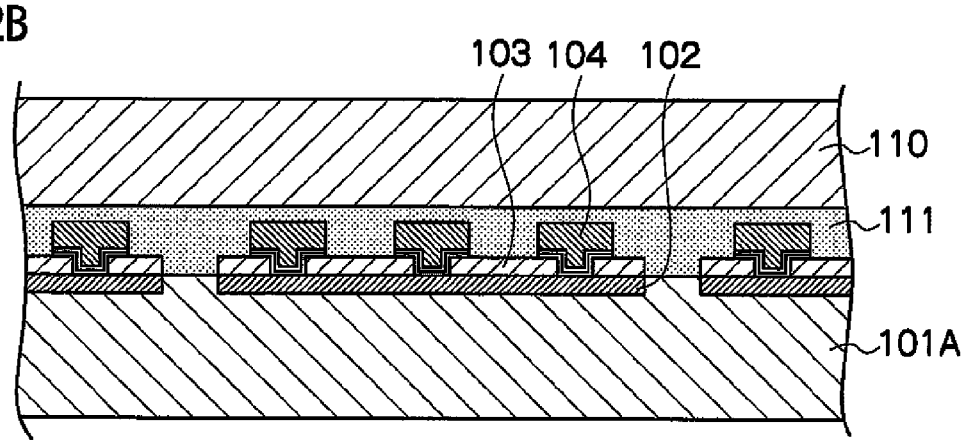
FIG. 2B is a process diagram showing the method of manufacturing a semiconductor device according to any one of the first to third embodiments of the invention.

The metal bump 104, which is electrically connected to the upper layer wiring 102 exposed from the protective film 103, is formed as described above, and then, a support substrate 110 such as a glass substrate is adhered to a surface of the semiconductor wafer 101A on which the metal bump 104 is formed through a UV (ultraviolet) cure adhesive 111 as shown in FIG. 2B.

Figure 2C:
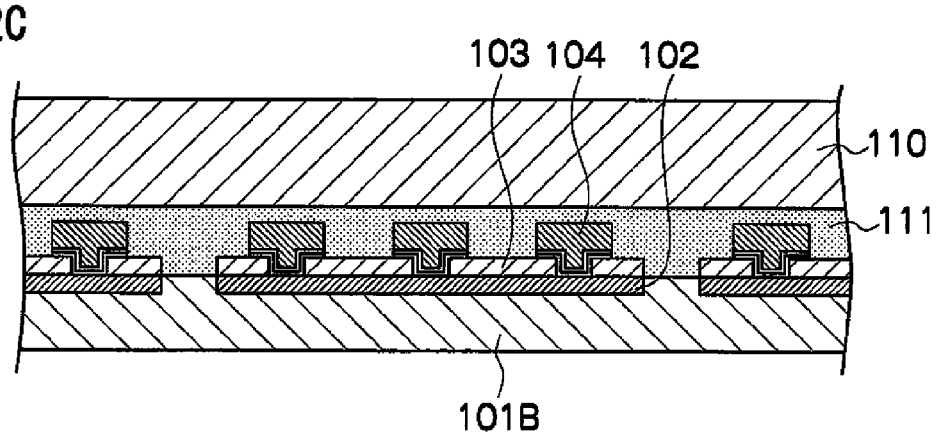
FIG. 2C is a process diagram showing the method of manufacturing a semiconductor device according to any one of the first to third embodiments of the invention.

Next, a back surface of the semiconductor wafer 101A, i.e., a surface of the semiconductor wafer 101A, on which the metal bump 104 such as the transistor and the device is not formed, is polished using the CMP (Chemical and Mechanical Polishing) method or a grind device, thereby thinning the semiconductor wafer 101A to a predetermined thickness as shown in FIG. 2C. At that time, the thickness of the semiconductor wafer 101B after polishing can be about 50 μm for example.

Figure 3A:
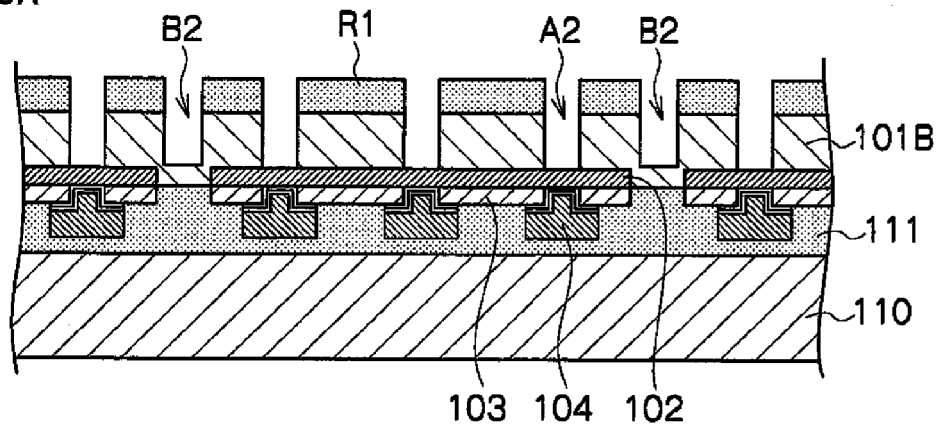
FIG. 3A is a process diagram showing the method of manufacturing a semiconductor device according to the first embodiment of the invention.
Figure 3B:
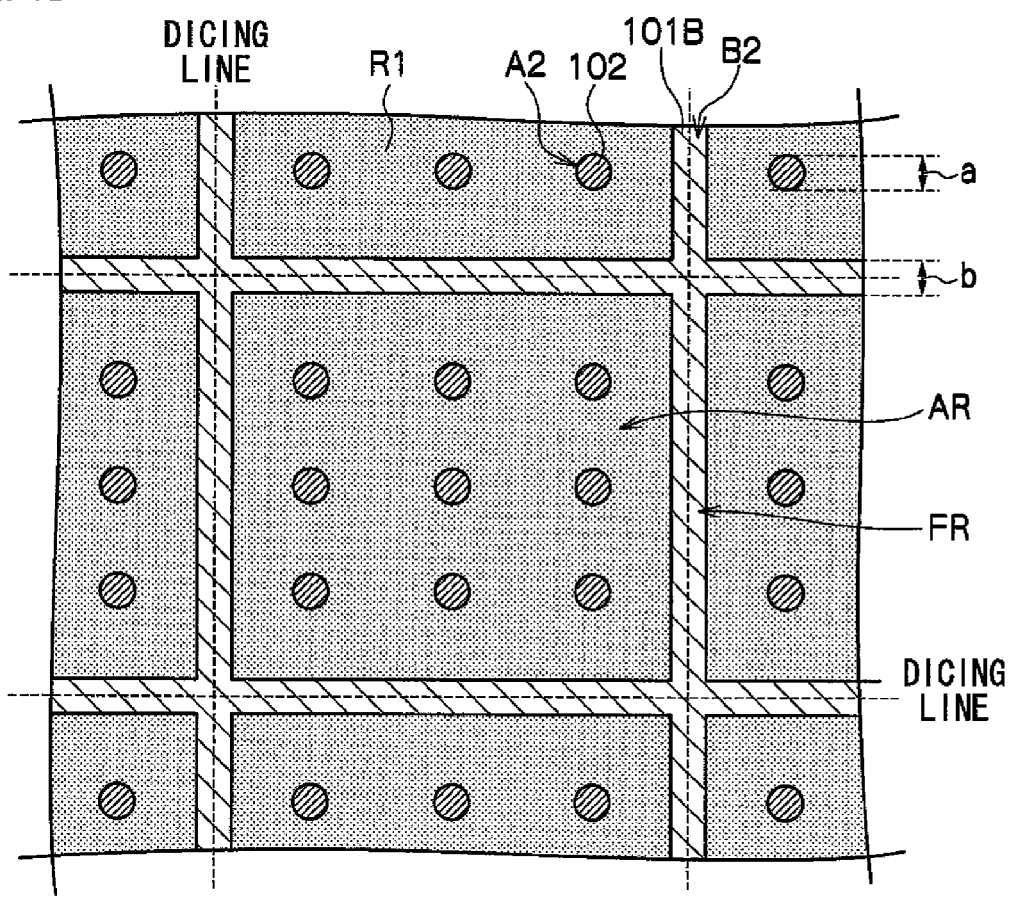
FIG. 3B is a process diagram showing the method of manufacturing a semiconductor device according to the first embodiment of the invention.

Next, the semiconductor wafer 101B is turned over, and the upper surface of the semiconductor wafer 101B, i.e., the back surface before the semiconductor wafer 101B is turned over is formed with a photoresist R1 having a predetermined opening pattern using a photolithography technique. The predetermined opening pattern includes an opening (first opening) located at a portion on the upper layer wiring 102, and an opening (second opening) extending along the dicing line. Next, the semiconductor wafer 101B is etched from its back surface using the photoresist R1 as a mask by means of the etching method capable of excavating a wafer surface in the vertical direction such as the Deep-RIE. With this, a through hole A2 through which the upper layer wiring 102 is exposed from the back surface of the semiconductor wafer 101B and a groove B2 excavated from the back surface of the semiconductor wafer 101B along the dicing line are formed as shown in FIGS. 3A and 3B.

The first opening in the photoresist R1 is an opening for forming the through hole A2. The second opening is an opening for forming a band-like groove B2 extending along the dicing line. Here, in this embodiment, the shape of the first opening is a circular, and a diameter (also called width) a of the first opening and a width b of the second opening are set substantially equal to each other as shown in FIG. 3B. In this embodiment, the diameter a and the width b are set to about 10 to 30 μm. By setting the diameter a and the width b substantially equal to each other, the depth of the groove B2 excavated from the second opening and the depth of the through hole A2 excavated from the first opening can beset substantially equal to each other or the depth of the groove B2 can be made deeper than that of the through hole A2 by the over etching amount. In this embodiment, however, the over etching amount is such a value that groove B2 does not completely penetrate the semiconductor wafer 101B. The over etching in this step is for reliably exposing the upper layer wiring 102 from the back surface of the semiconductor wafer 101B.

Figure 4A:
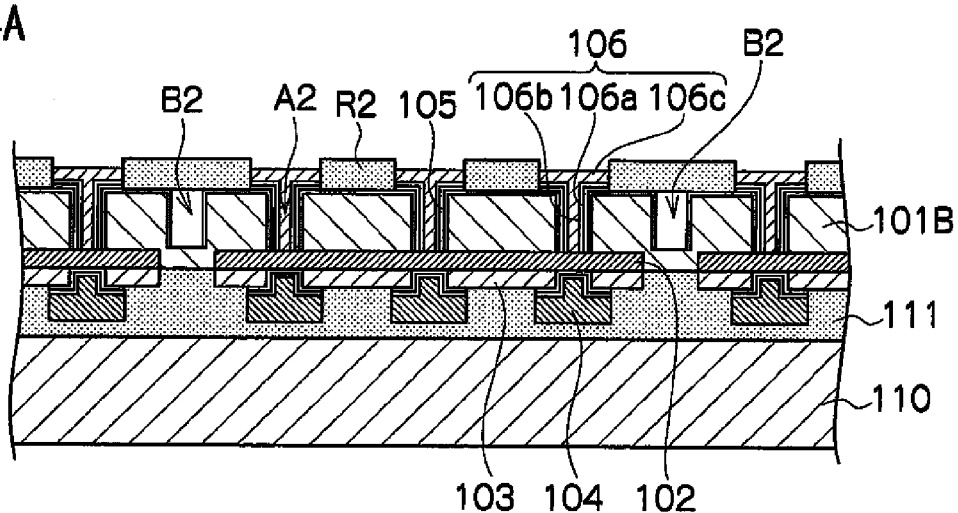
FIG. 4A is a process diagram showing the method of manufacturing a semiconductor device according to any one of the first to third embodiments of the invention.

The through hole A2 from which the upper layer wiring 102 is exposed and the groove B2 which does not penetrate the semiconductor wafer 101B are formed in the same step in this manner. Next, the back surface of the semiconductor wafer 101B is thermally oxidized, thereby forming an insulating film 105 on the back surface of the semiconductor wafer 101B and an inner surface of the through hole A2. With this, when the insulating film 105 is formed on the bottom of the through hole A2, i.e., on the back surface of the upper layer wiring 102, the upper layer wiring 102 on the bottom of the through hole A2 is exposed by removing the insulating film 105 at this portion by etching for example. Then, the film-like photoresist R2 is adhered on the back surface of the semiconductor wafer 101B in which the through hole A2 and the groove B2 are formed and then, this is exposed to light using a predetermined pattern, thereby forming an opening at least in the photoresist R2 through which the through hole A2 is exposed. The groove B2 is covered with the photoresist R2. Then, the penetrating electrode 106 which is electrically connected to the upper layer wiring 102 is formed in the through hole A2. With this, a semiconductor device having a cross section structure as shown in FIG. 4A is manufactured. The semiconductor device shown in FIG. 4A is in a state before it is diced. The penetrating electrode 106 includes a diffusion-preventing film 106a, a backing metal film 106b and a metal-plated film 106c like the metal bump 104. The diffusion-preventing film 106a is a film for preventing atoms forming the metal-plated film 106c from being diffused. The metal-plated film 106c is a main wiring portion of the penetrating electrode 106. The backing metal film 106b is a film functioning as a seed layer when the metal-plated film 106c which is the main wiring portion is formed by the electrolytic plating method. The penetrating electrode 106 having such a structure can be formed using the same forming step as that of the metal bump 104 explained above. Thus, detailed explanation will be omitted here.

Figure 4B:
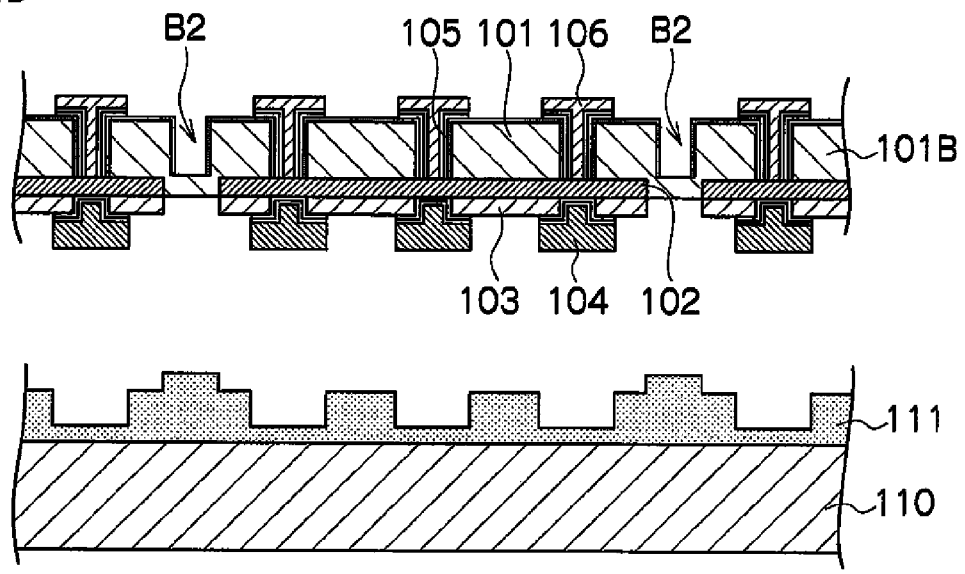
FIG. 4B is a process diagram showing the method of manufacturing a semiconductor device according to any one of the first to third embodiments of the invention.

Next, after the photoresist R2 is removed, the support substrate 110 which is pasted on the semiconductor wafer 101B is removed as shown in FIG. 4B. This can be carried out by irradiating the UV cure adhesive 111 with ultraviolet from the side of the support substrate 110 which is a glass substrate, and by curing the UV cure adhesive.

Figure 5A:
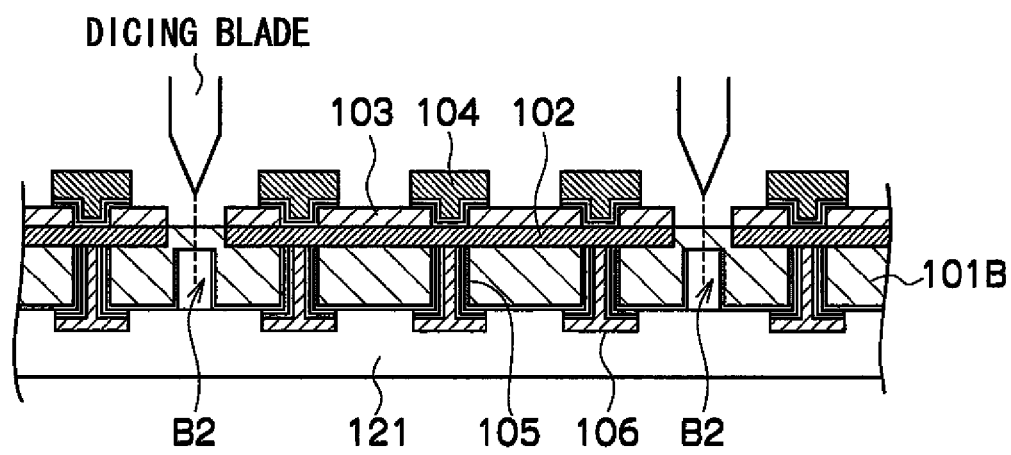
FIG. 5A is a process diagram showing the method of manufacturing a semiconductor device according to the first and second embodiments of the invention.
Figure 5B:
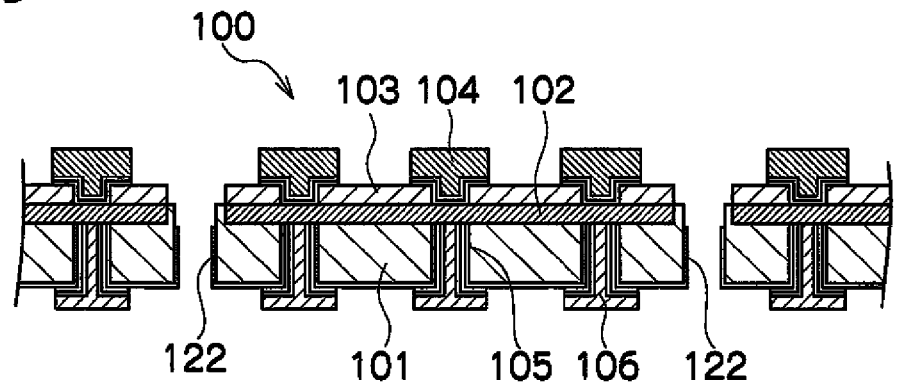
FIG. 5B is a process diagram showing the method of manufacturing a semiconductor device according to the first and second embodiments of the invention.

Next, a dicing tape 121 is pasted on the back surface of the semiconductor wafer 101B, i.e., a surface of the semiconductor wafer 101B opposite from a surface thereof on which the metal bump 104 is formed and then, the semiconductor wafer 101B is half diced using a predetermined dicing blade, thereby cutting the semiconductor wafer 101B along the dicing line into individual chips 101 as shown in FIG. 5A. With this, the diced semiconductor devices 100 are manufactured as shown in FIG. 5B. As a result of the above-described step, a cut surface made by the dicing blade is included in at least a portion of a side surface 122 of the diced semiconductor device 100. In this embodiment, the insulating film 105 may remain on a portion of the side surface 122.

As described above, the method of manufacturing a semiconductor device according to this embodiment includes a step for preparing the semiconductor wafer 101A having an upper surface (first surface) including a plurality of device regions and partition regions for dividing the plurality of device regions, and a back surface (second surface) opposite from the upper surface (first surface), a step for forming upper layer wirings 102 on the device regions on the upper surface (first surface), a step for etching the semiconductor wafer 101A from the back surface (second surface) by the Deep-RIE or the like, thereby forming the through hole A2 through which the upper layer wiring 102 is exposed, and for forming the groove B2 in a region of the back surface (second surface) corresponding to the partition region on the upper surface (first surface), and a step for dicing the semiconductor wafer 101A to form individual device regions.

By previously forming the groove B2 along the dicing line, it is possible to prevent the cut portion of the chip 101 from becoming chipped at the time of dicing. Further, by previously forming the groove B2 along the dicing line, since the thickness of the portion to be cut is thin, the efficiency of the dicing operation can be enhanced. Since the groove B2 can be formed in the same step as that of the through hole A2 for forming the penetrating electrode 106, the number of manufacturing steps is not increased.

Figure 6A:
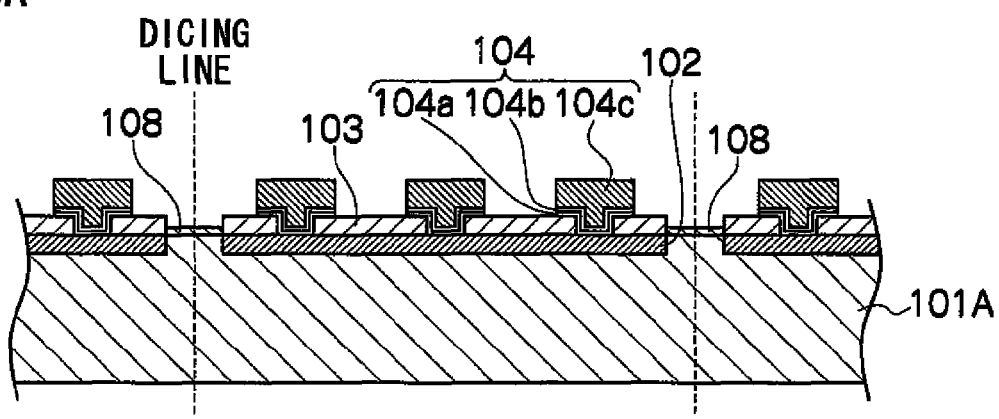
FIG. 6A is a process diagram showing a modification of the method of manufacturing a semiconductor device according to the first embodiment of the invention.
Figure 6B:
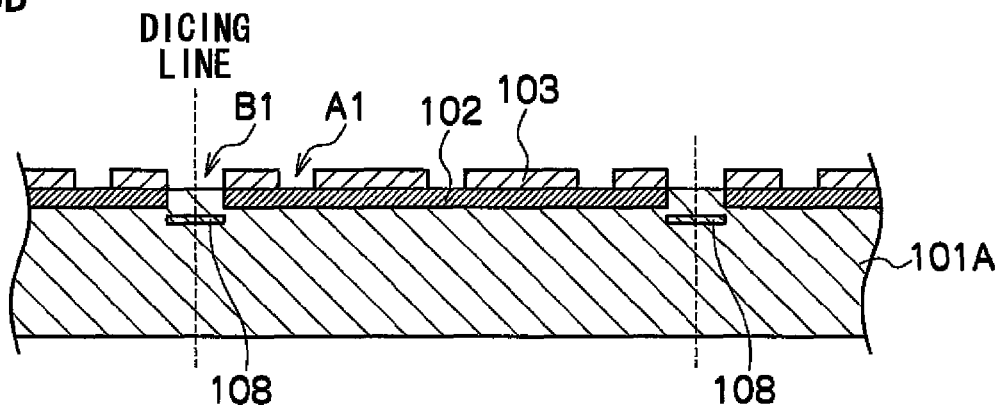
FIG. 6B is a process diagram showing a modification of the method of manufacturing a semiconductor device according to the first embodiment of the invention.

In this embodiment, the over etching amount in the Deep-RIE when the through hole A2 is formed is adjusted, thereby forming the groove B2 which does not penetrates the semiconductor wafer 101B along the dicing line, but the invention is not limited to this. That is, as shown in FIG. 6A, a step for forming a stopper film 108 along the dicing line is provided after the step shown in FIG. 2A, and the depth when the groove B2 is formed can be limited. Further, as shown in FIG. 6B, when the semiconductor wafer 101A including a device such as a transistor is to be formed, if the stopper film 108 is formed along a dicing line in any of layers in which the device or a wire is formed, it is possible to limit the depth of the groove B2. The stopper film 108 is a film for stopping the excavation carried out by the Deep-RIE. Thus, it is preferable that the stopper film 108 is formed of material capable of obtaining sufficient selection ratio with respect to the semiconductor wafer 101B. However, when the stopper film 108 is made of conductive material such as metal, an insulating film such as an oxide film is formed between the semiconductor wafer 101B and the stopper film 108. This stopper film 108 may be formed over the entire region along the dicing line or may be formed in a portion of a region along the dicing line to such a degree that chips are not separated after etching.

[Second Embodiment]

Next, a second embodiment of the invention will be explained in detail using the drawings. In the following explanation, the same elements as those of the first embodiment are designated with the same symbols, and detailed explanation thereof will be omitted. Structures which are not specifically described are the same as those of the first embodiment.

Figure 7A:
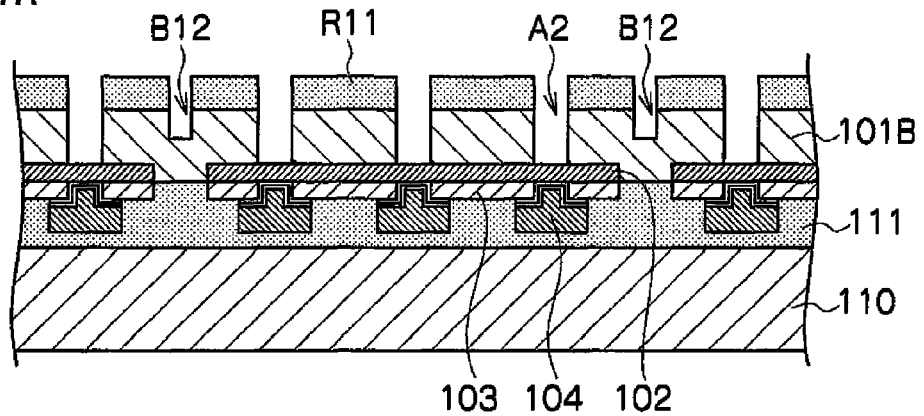
FIG. 7A is a process diagram showing the method of manufacturing a semiconductor device according to the second embodiment of the invention.
Figure 7B:
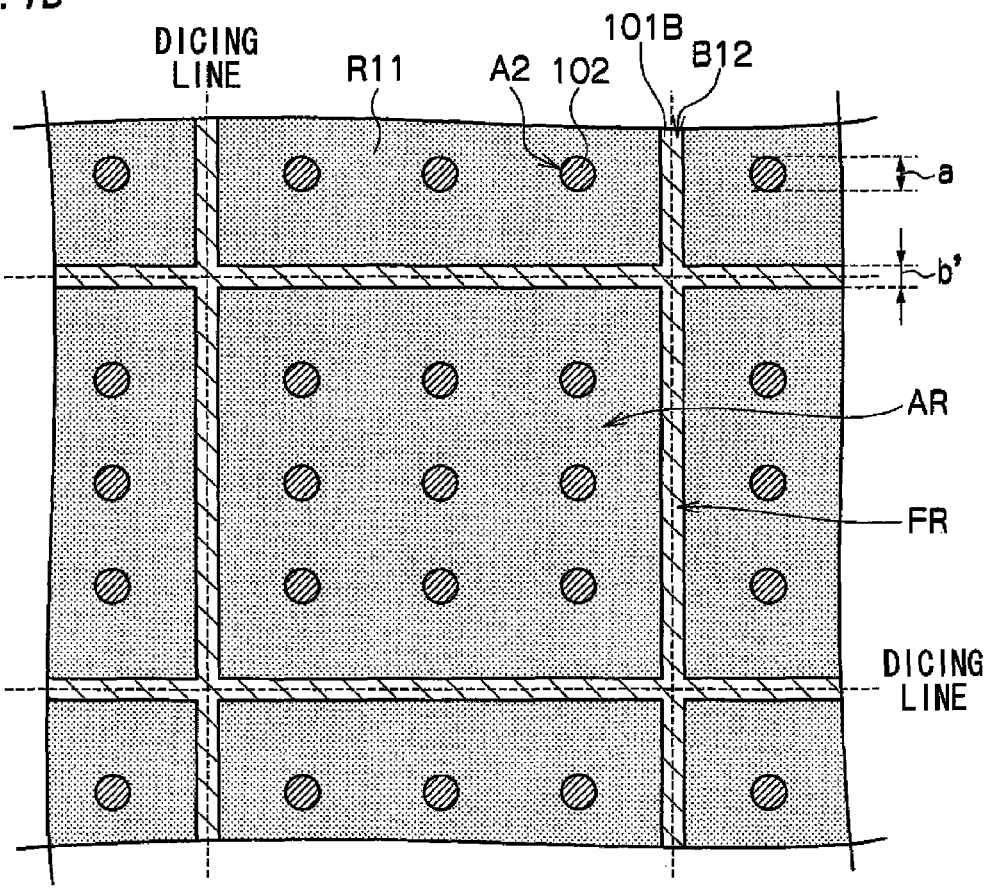
FIG. 7B is a process diagram showing the method of manufacturing a semiconductor device according to the second embodiment of the invention.

FIGS. 7A and 7B are process diagrams showing a method of manufacturing a semiconductor device of the embodiment. In this embodiment, the step for preparing the semiconductor wafer 101A to the step for polishing the back surface of the semiconductor wafer 101A (e.g., see FIGS. 1A to 2C), and the step for forming the insulating film 105 on the back surface of the semiconductor wafer 101B and the inner surface of the through hole A2 to the step for manufacturing diced semiconductor devices 100 by cutting the semiconductor wafer 101B into the individual chips 101 along the dicing line (e.g., see FIGS. 4A to 5B) are substantially the same as those in the first embodiment, detailed explanation thereof will be omitted.

As shown in FIGS. 7A and 7B, the photoresist R1 formed on the back surface of the semiconductor wafer 101B in the first embodiment is replaced by a photoresist R11, and the groove B2 formed along the dicing line of the semiconductor wafer 101B in the first embodiment is replaced by a groove B12.

The photoresist R11 includes a first opening for forming the through hole A2 and a second opening for forming the groove B12 like the photoresist R1 (see FIGS. 3A and 3B for example). Therefore, the photoresist R11 is used as a mask like the step explained in the first embodiment using FIGS. 3A and 3B, the semiconductor wafer 101B is etched from its back surface by the Deep-RIE, thereby forming, in the semiconductor wafer 101B, the through hole A2 through which the upper layer wiring 102 is exposed from the back surface of the semiconductor wafer 101B and the groove B12 excavated from the back surface of the semiconductor wafer 101B along the dicing line as shown in FIGS. 7A and 7B.

The groove B12 of the embodiment is formed shallower than the through hole A2. In the embodiment, the depth of the groove B12 can have about 1/5 to 3/5 of the thickness (e.g., 50 μm) of the semiconductor wafer 101B after polishing. This is because that if the depth of the groove B12 formed along the dicing line is shallow, it is possible to prevent the strength of the semiconductor wafer 101B from being deteriorated more than necessary.

To form the groove B12 shallower than the through hole A2 in the same step as that of the through hole A2, the width b' of the second opening for forming the groove B12 is set sufficiently narrower than a diameter a of the first opening for forming the through hole A2 in this embodiment. When the diameter a of the first opening is set to about 10 to 30 μm, the width b' of the second opening is set to about 5 to 10 μm. This is because that the depth of the hole excavated by etching depends on the size of the opening used as the mask. That is, by reducing the size of the opening, it is possible to shallow the depth of the hole excavated under the same etching condition.

Other steps are the same as those of the first embodiment or can easily be achieved from the steps explained in the first embodiment, detailed explanation will be omitted here.

As described above, like the first embodiment, the method of manufacturing a semiconductor device of this embodiment includes a step for preparing the semiconductor wafer 101A having an upper surface (first surface) including a plurality of device regions and partition regions for dividing the device regions, and a back surface (second surface) opposite from the upper surface (first surface), a step for forming upper layer wirings 102 on the device regions of the upper surface (first surface), a step for etching the semiconductor wafer 101A from the semiconductor wafer 101A from the back surface (second surface) by the Deep-RIE for example, thereby forming the through hole A2 through which the upper layer wiring 102 is exposed, and forming a groove B12 in a region of the back surface (second surface) corresponding to the partition region of the upper surface (first surface), and a step for dicing the semiconductor wafer 101A to form individual device regions.

By previously forming the groove B12 along the dicing line in this manner, the same effect as that of the first embodiment can be obtained. If the depth of the groove B12 is set shallower that that of the through hole A2, the strength of the semiconductor wafer 101B in the subsequent step can be maintained. As a result, damage of the semiconductor wafer 101B can be reduced in the subsequent step and the yield can be enhanced.

[Third Embodiment]

Next, a third embodiment of the invention will be explained in detail using the drawings. In the following explanation, the same elements as those of the first or second embodiments are designated with the same symbols, and detailed explanation thereof will be omitted. Structures which are not specifically described are the same as those of the first or second embodiments.

Figure 8A:
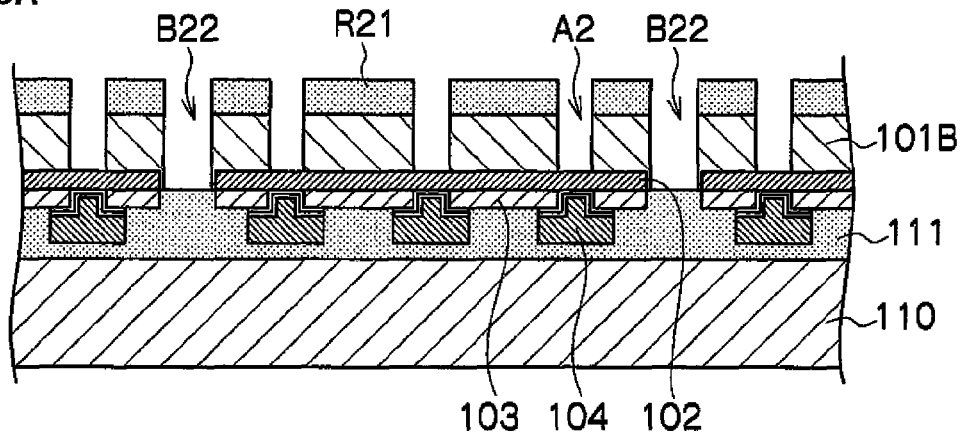
FIG. 8A is a process diagram showing the method of manufacturing a semiconductor device according to the third embodiment of the invention.
Figure 8B:
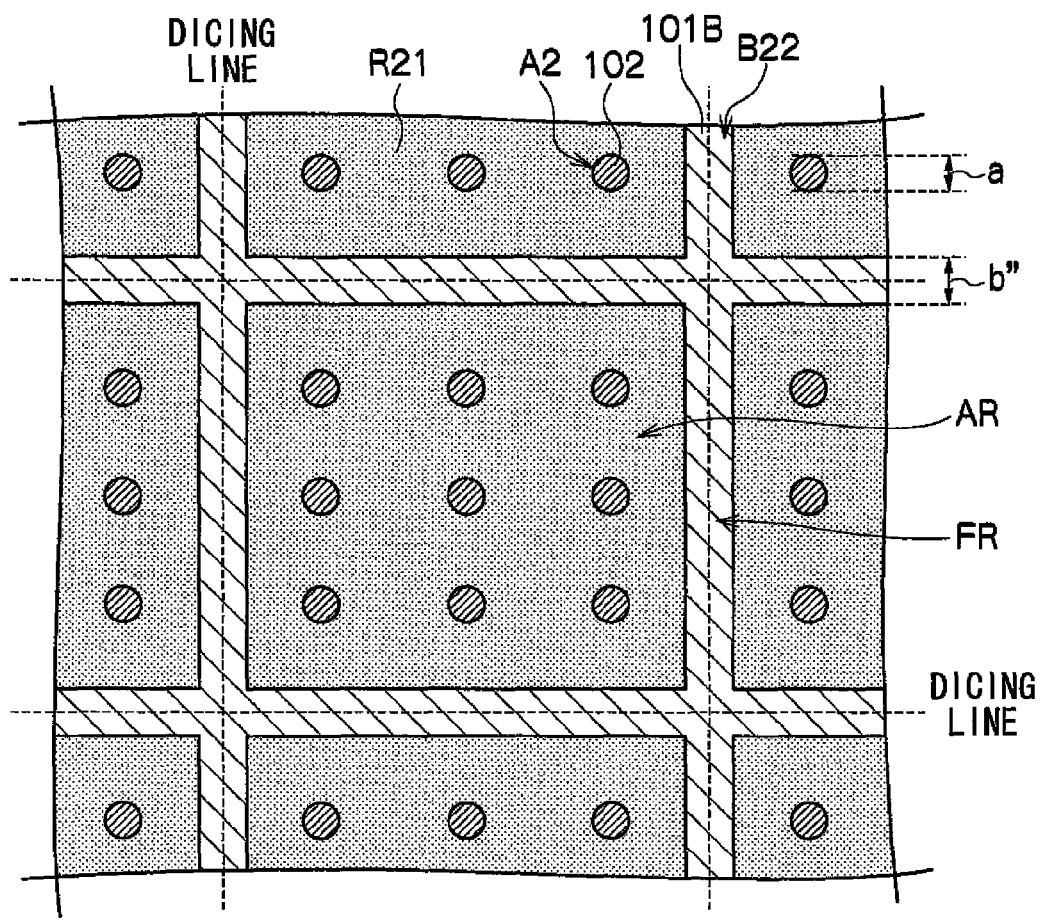
FIG. 8B is a process diagram showing the method of manufacturing a semiconductor device according to the third embodiment of the invention.

FIGS. 8A and 8B are process diagrams showing a method of manufacturing a semiconductor device of the embodiment. In this embodiment, the step for preparing the semiconductor wafer 101A to the step for polishing the back surface of the semiconductor wafer 101A (e.g., see FIGS. 1A to 2C), and the step for forming the insulating film 105 on the back surface of the semiconductor wafer 101B and the inner surface of the through hole A2 to the step for detaching the support substrate 110 form the semiconductor wafer 101B (e.g., see FIGS. 4A to 4B) are substantially the same as those in the first embodiment, detailed explanation thereof will be omitted.

As shown in FIGS. 8A and 8B, the photoresist R1 formed on the back surface of the semiconductor wafer 101B in the first embodiment is replaced by a photoresist R21, and the groove B2 formed along the dicing line of the semiconductor wafer 101B in the first embodiment is replaced by a groove B22.

Like the photoresist R1 (see FIGS. 3A and 3B for example) in the first embodiment, the photoresist R21 includes a first opening for forming the through hole A2, and a second opening for forming the penetrating groove B22. Therefore, like the steps explained using FIGS. 3A and 3B in the first embodiment, the photoresist R21 is used as a mask, the semiconductor wafer 101B is etched from its back surface by the Deep-RIE for example, thereby forming, in the semiconductor wafer 101B, the through hole A2 through which the upper layer wiring 102 is exposed from the back surface of the semiconductor wafer 101B, and the penetrating groove B22 excavated from the back surface of the semiconductor wafer 101B along the dicing line as shown in FIGS. 8A and 8B.

However, the penetrating groove B22 penetrates the semiconductor wafer 101B. That is, in this embodiment, the semiconductor wafer 101B is cut into chips 101 by the penetrating groove B22 formed in the same step as that of the through hole A2. As a result, in this embodiment, the step explained using FIG. 5A in the first embodiment, i.e., the step for cutting the semiconductor wafer 101B into the individual chips 101 along the dicing line is unnecessary.

The penetrating groove B22 which penetrates the semiconductor wafer 101B is formed in the same step as that of the through hole A2, the width b" of the second opening for forming the penetrating groove B22 can sufficiently be wider than the diameter a of the first opening first opening for forming the through hole A2.

Other steps are the same as those of the first embodiment or can easily be achieved from the steps explained in the first embodiment, and detailed explanation will be omitted here. However, since the step for cuffing the semiconductor wafer 101B into chips 101 using a dicing blade or the like is unnecessary in the manufacturing method of this embodiment. This is because that since the penetrating groove B22 is formed, and the semiconductor wafer 101B is diced into the chips 101 in a state where the semiconductor wafer 101B is pasted to the support substrate 110. The step for detaching the semiconductor device 100 from the support substrate 110 is the same as that explained using FIG. 4B in the first embodiment.

As described above, like the first embodiment, the method of manufacturing a semiconductor device of this embodiment includes a step for preparing the semiconductor wafer 101A having an upper surface (first surface) including plural device regions and partition regions for dividing the device regions, and a back surface (second surface) opposite from the upper surface (first surface), a step for forming upper layer wirings 102 on the device regions of the upper surface (first surface), a step for etching the semiconductor wafer 101A from the semiconductor wafer 101A from the back surface (second surface) by the Deep-RIE for example, thereby forming the through hole A2 through which the upper layer wiring 102 is exposed, and forming a groove B22 which penetrates the semiconductor wafer 101A in the region of the back surface (second surface) corresponding to the upper surface (first surface).

In this manner, the step for dicing the semiconductor wafer 101B to form individual device regions is unnecessary in the subsequent step by forming the penetrating groove B22 along the dicing line, and it is possible to prevent the cut portion of the chip 101 from becoming chipped by the dicing. Further, the penetrating groove B22 can be formed in the same step as that of the through hole A2 for forming the penetrating electrode 106, the number of manufacturing steps is not increased.

It is obvious from the above description that the first to third embodiments are only examples for carrying out the invention, the invention is not limited to the embodiments, the embodiments can variously be modified within the scope of the invention, and various other embodiments can be also be made within a range of the invention.

What is claimed is:

1. A method of manufacturing a semiconductor device comprising:
   preparing a semiconductor wafer having a first surface including a plurality of device regions and partition regions for dividing the plurality of device regions and further having a second surface opposite from the first surface,
   forming wires on each of the device regions of the first surface,
   forming metal bumps on the wires,
   forming a stopper film at the partition regions on the first surface of the semiconductor wafer, that limits excavation by etching,
   etching the semiconductor wafer from a side of the second surface to form in each of the device regions a through hole that exposes a wire, and to form a groove that exposes the stopper film in a region of the second surface corresponding to a partition region of the first surface around each of the device regions, wherein a depth of the groove is equal to or greater than a depth of the through hole,
   forming in the through holes penetrating electrodes that are electrically connected to the wires, and
   dicing the semiconductor wafer to form individual device regions by cutting the semiconductor wafer along the groove from a side of the first surface.

2. A method of manufacturing a semiconductor device comprising:
   preparing a semiconductor wafer having a first surface including a plurality of device regions and partition regions for dividing the plurality of device regions and further having a second surface opposite from the first surface,
   forming wires on each of the device regions of the first surface,
   forming metal bumps on the wires,
   forming a stopper film at the partition regions on the first surface of the semiconductor wafer, that limits excavation by etching,
   etching the semiconductor wafer from a side of the second surface to form in each of the device regions a through hole that exposes a wire, and to form a groove that exposes the stopper film in a region of the second surface corresponding to the partition region of the first surface around each of the device regions, and
   forming in the through holes penetrating electrodes that are electrically connected to the wires
   wherein a depth of the groove is equal to or larger than a depth of the through hole.

3. The method of manufacturing a semiconductor device of claim 1, wherein a width of the groove is the same as a width of the through hole.

4. The method of manufacturing a semiconductor device of claim 2, wherein a width of the groove is the same as a width of the through hole.

5. A method of manufacturing a semiconductor device comprising:
   preparing a semiconductor wafer having a first surface including a plurality of device regions and partition regions for dividing the plurality of device regions and further having a second surface opposite from the first surface,
   forming wires on each of the device regions of the first surface,
   forming metal bumps on the wires,
   forming a stopper film at the partition regions on the first surface of the semiconductor wafer, that limits excavation by etching,
   etching the semiconductor wafer from a side of the second surface to form a through hole in at least one of the device regions that exposes a wire, and to form a groove that exposes the stopper film in a region of the second surface corresponding to a partition region of the first surface around each of the device regions, the through hole and the groove are etched simultaneously, wherein a depth of the groove is equal to or greater than a depth of the through hole,
   forming in the through holes penetrating electrodes that are electrically connected to the wires, and
   dicing the semiconductor wafer to form individual device regions by cutting the semiconductor wafer along the groove from a side of the first surface.

6. The method of manufacturing a semiconductor device of claim 5, wherein said etching comprises etching the groove and the through hole to have a same depth.

7. The method of manufacturing a semiconductor device of claim 5, wherein said etching comprises etching the groove entirely through the semiconductor wafer from the second surface to the first surface.

* * * * *